United States Patent
Chen et al.

(10) Patent No.: US 9,337,084 B1
(45) Date of Patent: May 10, 2016

(54) METHOD FOR MANUFACTURING CONTACT HOLES OF A SEMICONDUCTOR DEVICE

(71) Applicant: UNITED MICROELECTRONICS CORP., Hsin-Chu (TW)

(72) Inventors: Chieh-Te Chen, Kaohsiung (TW);
Feng-Yi Chang, Tainan (TW);
Kun-Yuan Liao, Hsin-Chu (TW);
Chun-Lung Chen, Tainan (TW);
Ching-Pin Hsu, Tainan (TW);
Shang-Yuan Tsai, Kaohsiung (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/846,822

(22) Filed: Sep. 6, 2015

(51) Int. Cl.
*H01L 21/768* (2006.01)
*H01L 27/11* (2006.01)

(52) U.S. Cl.
CPC .... *H01L 21/76816* (2013.01); *H01L 21/76805* (2013.01); *H01L 21/76895* (2013.01); *H01L 27/1104* (2013.01)

(58) Field of Classification Search
None
See application file for complete search history.

(56) References Cited

U.S. PATENT DOCUMENTS

| 2012/0164835 | A1* | 6/2012 | Wu | H01L 21/0337 438/694 |
| 2014/0300000 | A1* | 10/2014 | Chao | H01L 21/76811 257/774 |
| 2014/0327080 | A1* | 11/2014 | Hung | H01L 29/66515 257/365 |
| 2014/0349476 | A1* | 11/2014 | Chen | H01L 21/76816 438/620 |

OTHER PUBLICATIONS

Hung, Title of Invention: Method for Manufacturing a Contanct Structure Used to Electrically Connect a Semiconductor Device, U.S. Appl. No. 14/510,100, filed Oct. 8, 2014.

* cited by examiner

*Primary Examiner* — Andres Munoz
(74) *Attorney, Agent, or Firm* — Winston Hsu; Scott Margo

(57) ABSTRACT

The present invention provides a method for manufacturing contact holes of a semiconductor device, including a first dielectric layer is provided, a first region and a second region are defined on the first dielectric layer respectively, at least two cutting hard masks are formed and disposed within the first region and the second region respectively, at least two step-height portions disposed right under the cutting hard masks respectively. Afterwards, at least one first slot opening within the first region is formed, where the first slot opening partially overlaps the cutting hard mask and directly contacts the cutting hard mask, and at least one second contact opening is formed within the second region, where the second contact opening does not contact the cutting hard mask directly, and at least two contact holes are formed, where each contact hole penetrates through each step height portion.

14 Claims, 12 Drawing Sheets

A METHOD FOR MANUFACTURING CONTACT HOLES OF A SEMICONDUCTOR DEVICE

BACKGROUND OF THE INVENTION

1. Field of the Invention

The present invention relates generally to a method of manufacturing contact holes in an integrated circuit, and more particularly to a method of manufacturing contact holes in different regions, such as in a logic region and in a static random access memory (SRAM) region simultaneously.

2. Description of the Prior Art

Field effect transistors are important electronic devices in the fabrication of integrated circuits. As the sizes of the semiconductor devices becomes smaller and smaller, the fabrication of the transistors also has to be improved so as to fabricate transistors with smaller sizes and higher quality.

For a static random access memory (SRAM) comprised of transistors, the transistors are often electrically connected with one another through contacts and metal lines. By electrically connecting a portion of one transistor to a portion of another transistor, every six of the transistors can constitute a latch circuitry as well as a unit cell of the SRAM. Also, as the size of the SRAM continues to shrink, there is also a need to dispose contacts between the transistors and the metal lines of the SRAM, and these contacts are sometimes called M0 contacts. Generally, M0 contacts are formed on or above source/drain regions of the transistors and are often used to provide a short-distance electrical connection. However, because the densities of the M0 contacts are varied from region to region, the resolution of the corresponding photolithographic process for manufacturing the M0 contacts is often lowered by this non-uniform contact density.

Accordingly, there is still a need to provide a modified method for manufacturing contact structures, especially M0 contacts, in order to overcome the above-mentioned drawbacks.

SUMMARY OF THE INVENTION

The present invention provides a method for manufacturing contact holes of a semiconductor device, comprising: firstly, a first dielectric layer is provided, a first region and a second region being defined on the first dielectric layer respectively, next, at least two cutting hard masks are formed on the first dielectric layer, and disposed within the first region and the second region respectively, the first dielectric layer is then etched, so as to form at least two step-height portions disposed right under the cutting hard masks respectively, afterwards, at least one first slot opening within the first region is formed, wherein the first slot opening partially overlaps the cutting hard mask and directly contacts the cutting hard mask, and at least one second contact opening is formed within the second region, wherein the second contact opening does not contact the cutting hard mask directly, and at least two contact holes are formed within the first region and the second region respectively, wherein each contact hole penetrates through the step height portion.

In summary, the key feature of the present invention is to provide a method for forming contact holes of a semiconductor device, the semiconductor device including two regions: a first region and a second region, wherein in manufacturing processes, a slot cut process will be performed within the first region, but not performed within the second region. However, in one embodiment of the present invention, the cutting hard mask is not only formed within the first region, but also be formed within the second region. Since the following-formed contact plugs have the same depth, the vertical distance between the fin structure to the bottom surface of each contact plug can be controlled well, thereby avoiding the shorting issue.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-6 are schematic diagrams showing a semiconductor device according to the first preferred embodiment of the present invention, wherein FIGS. 1, 3 and 5 are schematic top view diagrams showing a semiconductor device according to the first preferred embodiment of the present invention, and FIGS. 2, 4 and 6 are schematic cross section diagrams showing a semiconductor device according to the first preferred embodiment of the present invention.

FIGS. 7-12 are schematic diagrams showing a semiconductor device according to the second preferred embodiment of the present invention, wherein FIGS. 7, 9 and 11 are schematic top view diagrams showing a semiconductor device according to the second preferred embodiment of the present invention, and FIGS. 8, 10 and 12 are schematic cross section diagrams showing a semiconductor device according to the second preferred embodiment of the present invention.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
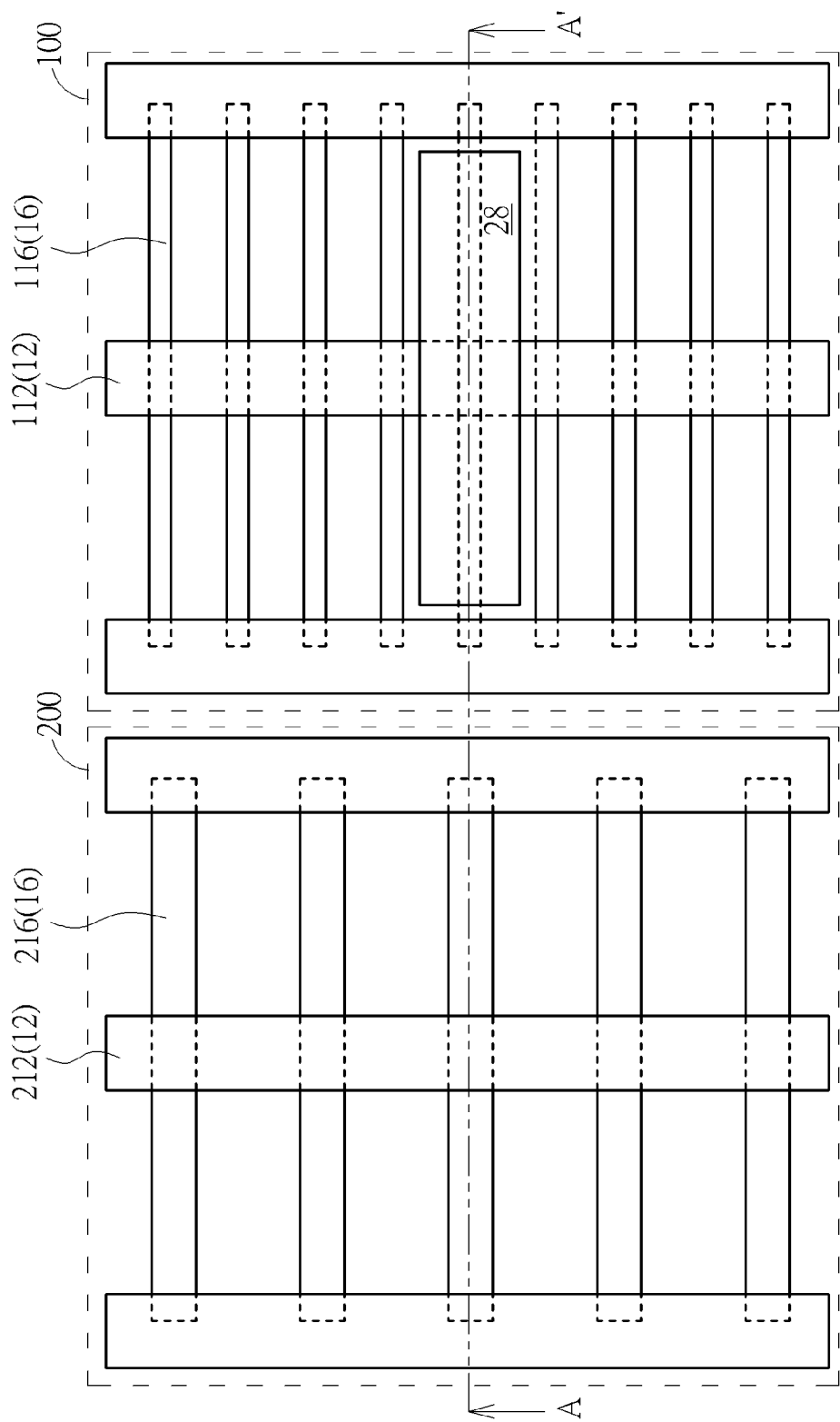
Figure 2:
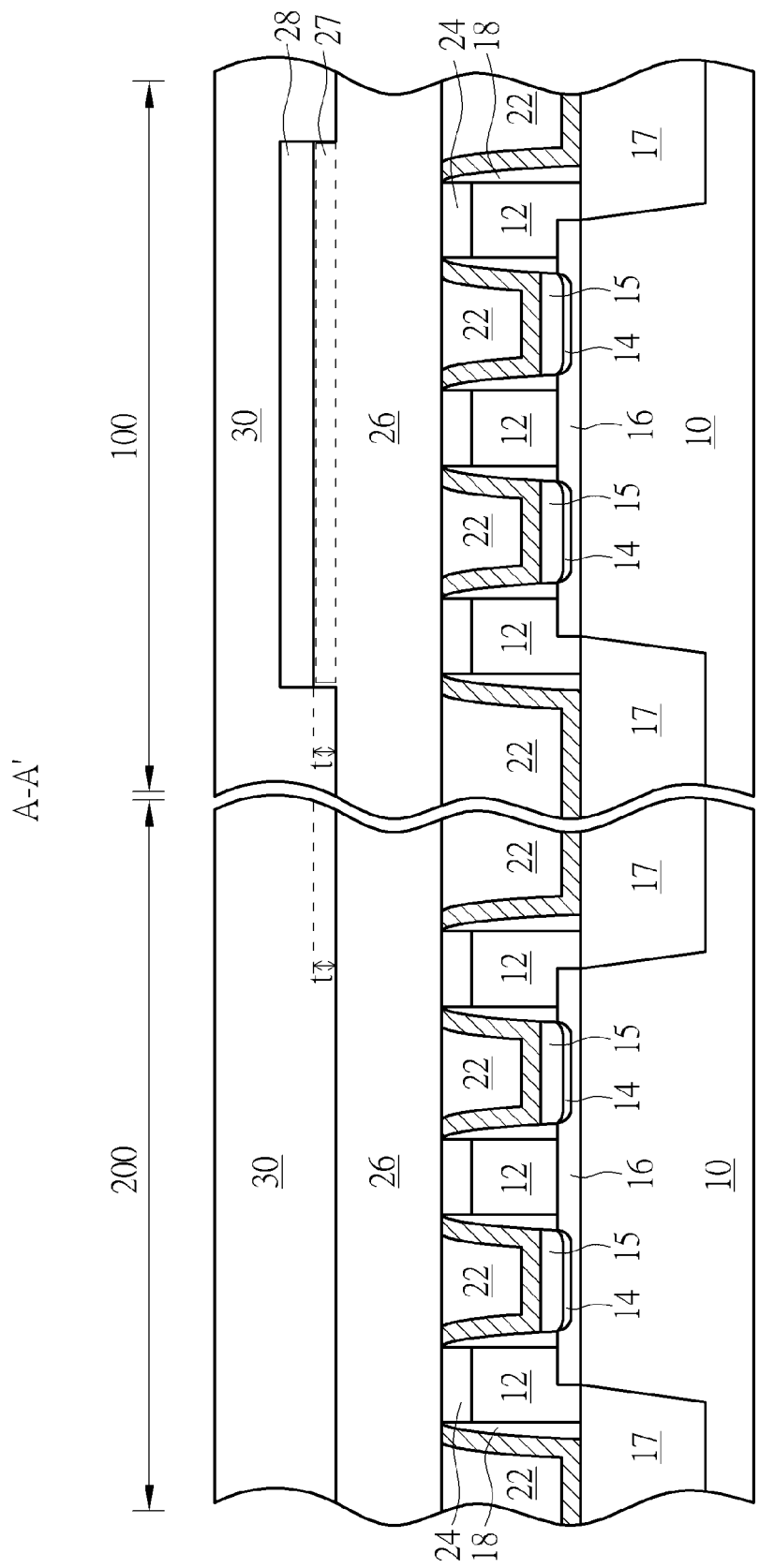
Figure 3:
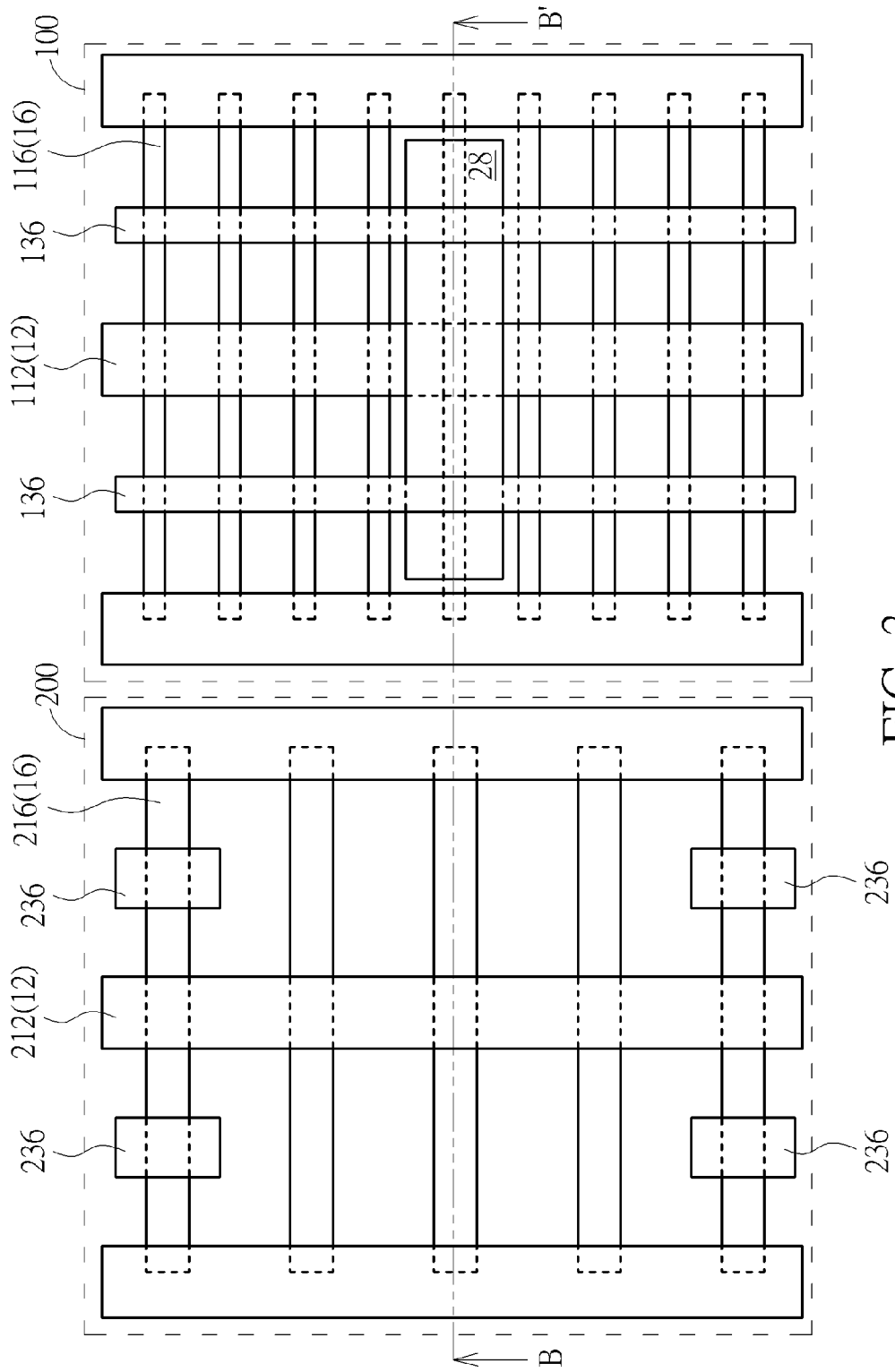
Figure 4:
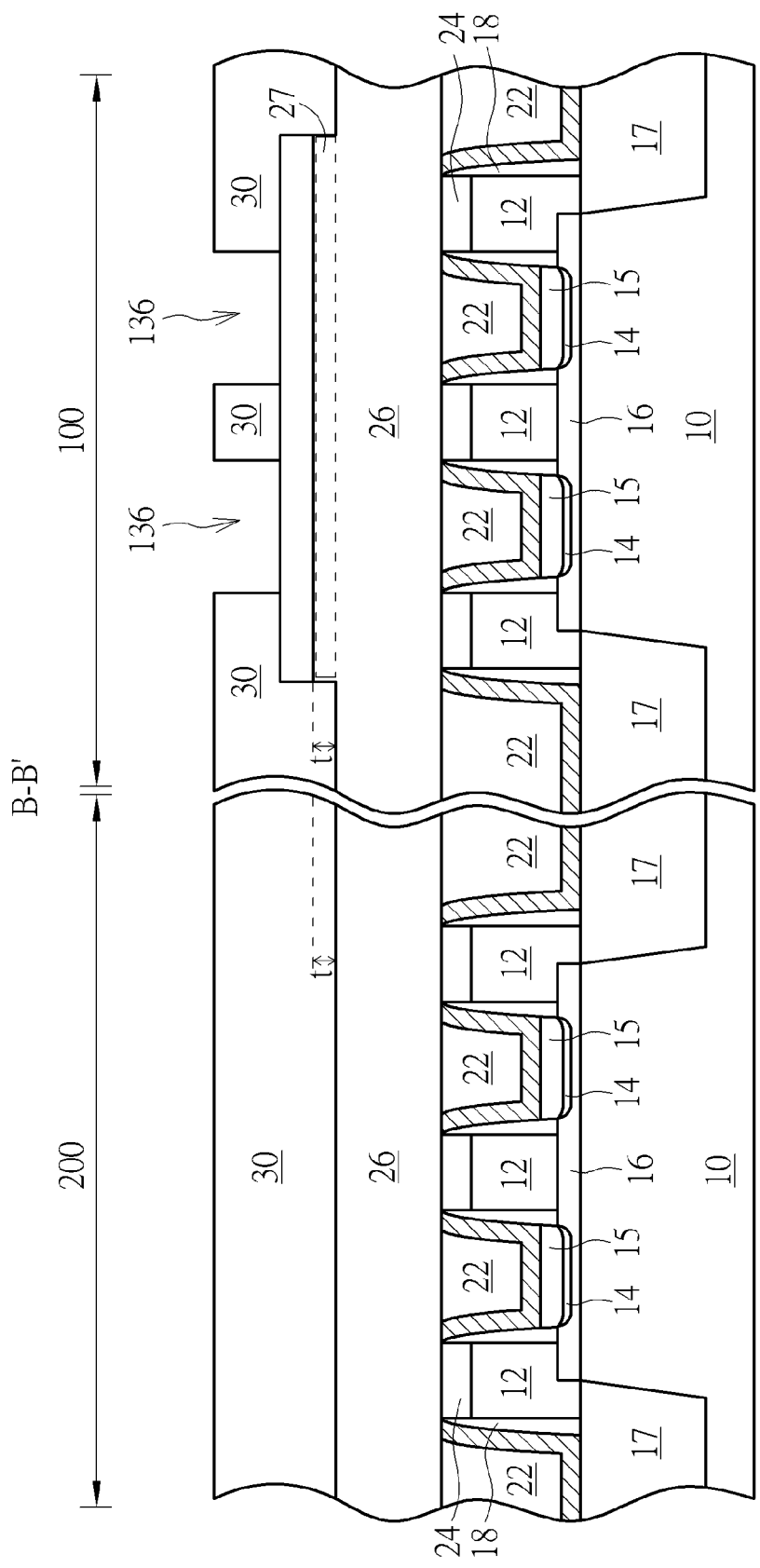
Figure 5:
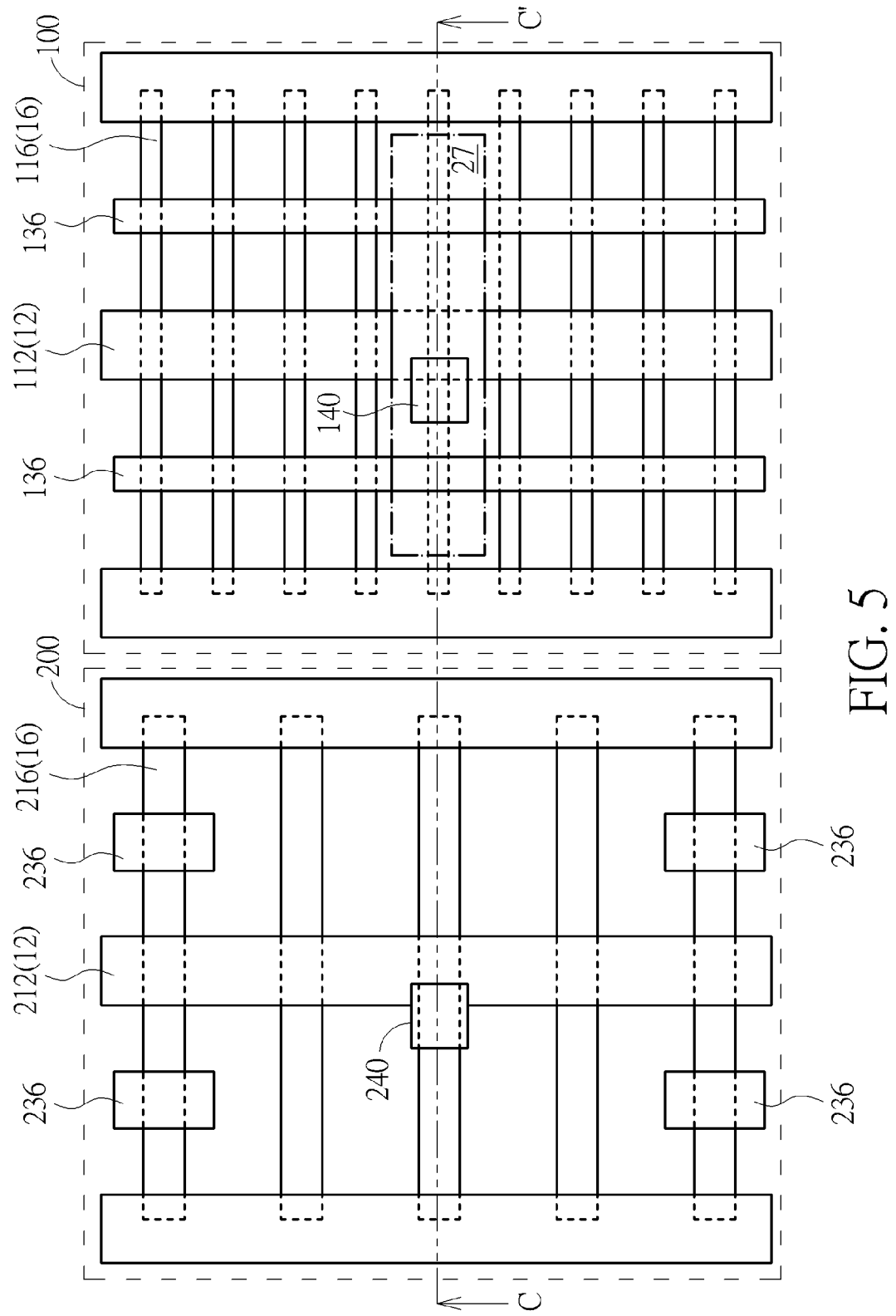
Figure 6:
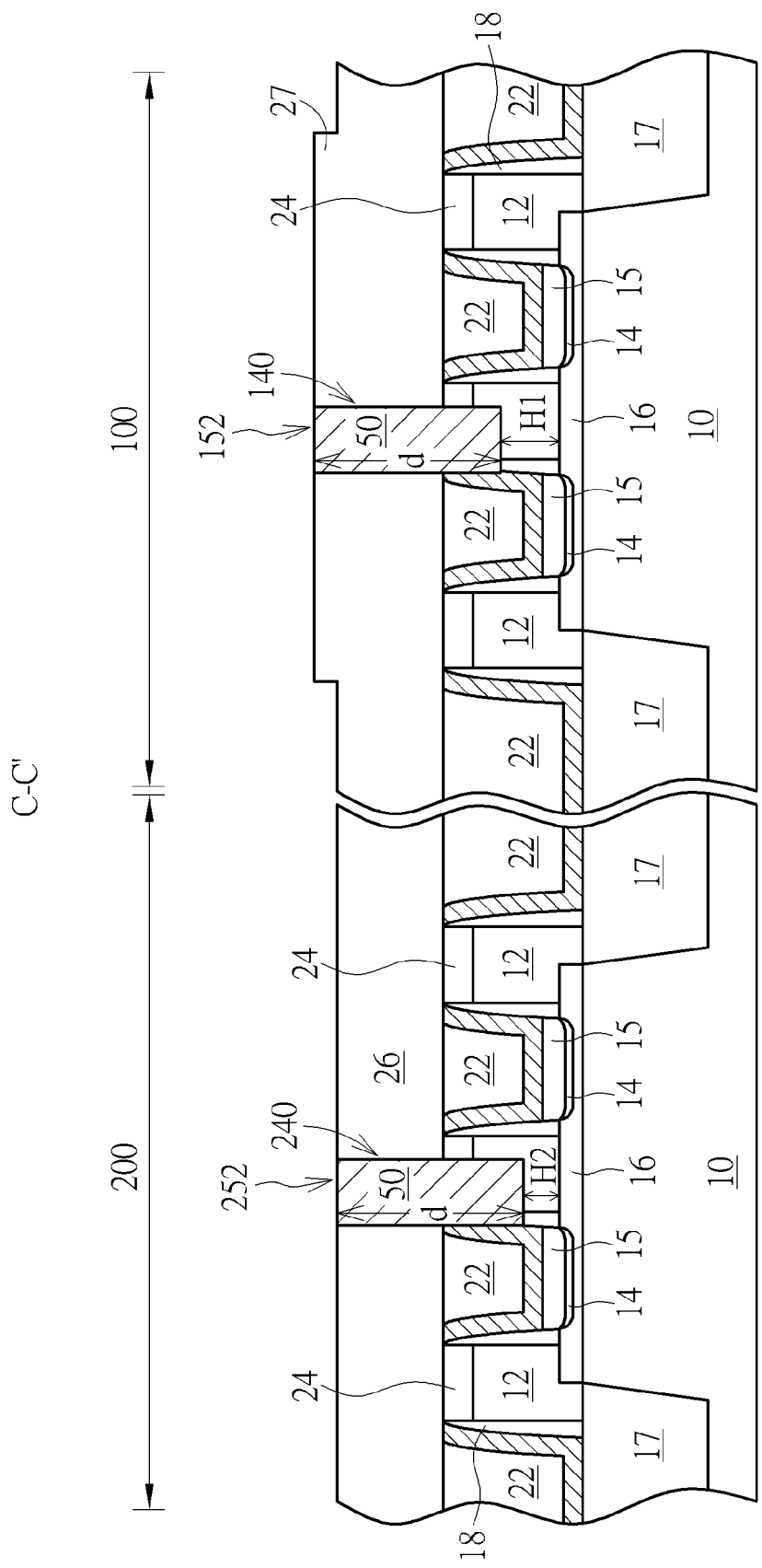

The present invention provides a method for manufacturing contact holes of a semiconductor device. Please refer to FIGS. 1-6, wherein FIGS. 1, 3 and 5 are schematic top view diagrams showing a semiconductor device according to the first preferred embodiment of the present invention, and FIGS. 2, 4 and 6 are schematic cross section diagrams showing a semiconductor device according to the first preferred embodiment of the present invention. As shown in FIG. 1, a semiconductor device 1 includes at least two regions: a first region 100 and a second region 200, which respectively represent different regions of a semiconductor device. The difference between the first region 100 and the second region 200 is that in the following steps, at least one slot-cut process will be performed within the first region 100, so as to divide a slot contact into two or more segments. But the slot-cut process does not need to be performed within the second region 200. Generally, the first region 100 includes the elements that has smaller size or critical dimension than that of the elements within the second region 200. For example, the first region 100 such as a region comprises at least one static random access memory (SRAM) disposed therein, and the second region 200 such as a region comprises at least one logic circuit.

In addition, please still refer to FIG. 1 and further refer to FIG. 2, wherein FIG. 2 shows the cross section diagram along the cross section line A-A' in FIG. 1. The semiconductor device 1 also comprises a substrate 10, wherein the substrate 10 comprises a plurality of metal gates 12 disposed on the substrate 10 and within the first region 100 and within the second region 200 respectively. In this embodiment, the metal gate 12 that is disposed within the first region 100 is labeled as a metal gate 112, and the metal gate 12 that is disposed within the second region 200 is labeled as a metal gate 212. Besides, at least two source/drain regions (S/D regions) 14 are disposed on at least one side of the metal gate 112, 212 respectively. It is noteworthy that the S/D regions 14 are disposed within both the first region 100 and the second region 200 respectively, but to simplify the description, all of the S/D regions, whether they are disposed within the first region 100 or the second region 200 are labeled as the S/D region 14. In the following paragraphs, some other elements will also follow this rule: when the applicant wants to point out one element within a specific region, the region will be included in the description, for example: the S/D region 14 within the first region 100.

Besides, the substrate 10 further comprises a plurality of fin structures 16 disposed on the substrate 10, in this embodiment, the fin structures 16 that are disposed within the first region 100 are labeled as fin structures 116, and the fin structures 16 that are disposed within the second region 200 are labeled as a fin structures 216. The arrangement direction of each fin structure 16 is perpendicular to the arrangement direction of each gate structure 12. In this embodiment, the metal gate 12 may cross the fin structure 16 disposed on the substrate 10, or may be disposed on the edge of the fin structure 16 to protect the fin structure 16.

Besides, the metal gates 12 (including the metal gates 112 or 212) comprise metal materials, and the S/D regions 14 can be formed on two sides of each metal gate 12 on the substrate 10 through an ion implantation process, or formed on the fin structure 16 (including the fin structure 116 or 216) disposed on two sides of each metal gates 12. The method of the present invention further comprises forming at least one shallow trench isolation (STI) 17 in the substrate 10 surrounding the metal gate 12, to isolate the metal gate 12 from other electric elements on the substrate 10.

In addition, the method of the present invention further comprises selectively forming an epitaxial layer 15 in the S/D region 14 within both the first region 100 and the second region 200. The epitaxial layer 15 can be regarded as a part of the S/D region 14. Afterwards, a spacer 18 and a contact etching stop layer (CESL) 20 may be formed on two sides of the metal gate 12. A first inter-layer dielectric (ILD) 22 is then formed on the substrate 10, and a planarization process is then performed, such as a chemical mechanical polishing (CMP), to have the top surface of the metal gate 12 and the top surface of the first inter-layer dielectric 22 on the same level. Please note that the metal gate 12 can be formed by replacing a dummy gate with metal after the planarization process. It is worth noting that in this embodiment, a cap layer 24 can be selectively formed, disposed on the metal gate 12. The manufacturing method of the hard mask comprises: after the metal gate 12 is completed, an etching process is performed to remove parts of the metal gate 12, and the cap layer 24 is then formed on the metal gate 12. Another planarization process is then performed to remove the extra cap layer 24. In other words, in the present embodiment, the top surface of the cap layer 24 and the top surface of the first inter-layer dielectric 22 are on the same level (as shown in FIG. 2). Besides, since the cap layer 24 replaces some top portion of the metal gate 12, the cap layer 24 is therefore disposed only on the metal gate 12, and disposed between the spacers 18. But it is noteworthy that the present invention is not limited to forming the hard mask. In another case, there is no hard mask formed on the metal gate 12.

Afterwards, a second dielectric layer 26 is then formed on the first ILD 22. According to the preferred embodiment, the second dielectric layer 26 can be a single layer structure or a multiple layer structure, such as a silicon oxide layer or a silicon nitride layer. Next, within the first region 100, in order to form a slot cut element that is used for dividing the following formed slot contact, a material layer (not shown) is formed on the second dielectric layer 26, the material layer made of the materials different from that of the first ILD 22 and the second dielectric layer 26, such as such as titanium nitride (TiN), but not limited thereto. Next, a patterned photoresist layer (not shown) is formed on the material layer to serve as the hard mask, and the material layer is patterned through an etching process, so as to form at least one cutting hard mask 28 on the second dielectric layer 26 and within the first region 100. It is noteworthy that after the etching process for forming the cutting hard mask 28 is performed, parts of the second dielectric layer 26 are removed, so except for the region that covered by the cutting hard mask 28, the thickness of other regions of the second dielectric layer 26 will decreased for a thickness (t), and therefore a step-height portion 27 is formed on the second dielectric layer 26. Next, a third dielectric layer 30 is formed, such as a planarization layer, covering the second dielectric 26 and on the cutting hard mask 28. It is noteworthy that in order to simplify the description, FIG. 1 only shows the metal gates 12, the fin structures 16 and the cutting hard mask 28. Other elements shown in FIG. 2 are omitted and not shown in FIG. 1.

As shown in FIG. 3, in order to form the metal plug that is electrically connected to the S/D region 14 (wherein the metal plug can replace the M0 and the lower contacts structure electrically connected to the S/D region in conventional process, denoted here as the 0th metal contact, M0CT), a M0CT etching process is then performed. More precisely, a hard mask (not shown) is firstly formed on the third dielectric 30 and on the cutting hard mask 28 within the first region 100 and within the second region 200. It is noteworthy that the hard mask includes a plurality of openings: some first openings disposed within the first region 100 and some second openings disposed within the second region 200, in this embodiment, each first opening is a slot opening, and partially overlaps the cutting hard mask 28. Afterwards, at least one etching process is performed, to transfer the patterns of the first openings and the patterns of the second openings to other layers disposed below, including the third electric layer 30, the second dielectric layer 26 and the first ILD 22, so as to form a plurality of first slot openings 136 at least in the first ILD 22 within the first region 100, and to form a plurality of second contact openings 236 at least in the first ILD 22 within the second region 200, and the S/D region 14 or the epitaxial layer 15 is finally exposed by the first slot openings 136 and the second contact openings 236. In addition, when viewed in a top view, the first slot opening 136 also partially overlaps with the cutting hard mask 28.

It is noteworthy that since the pattern of the first opening partially overlaps the cutting hard mask 28, during the etching process for forming the first slot openings 136, the cutting hard mask 28 cannot be removed, and it will still be disposed on the second dielectric layer 26 after the M0CT etching process is performed. In this way, the cutting hard mask 28 will protect the second dielectric layer 26 that is disposed right below it, and each first opening may be divided or be sectionalized into two first slot openings 136 in the first ILD 22 and in the second dielectric layer 26. In addition, since some of the third dielectric layer 30 is removed during the process for forming the first slot openings 136, the cutting hard mask 28 is then partially exposed by the first slot openings 136 (as shown in FIG. 4, wherein FIG. 4 shows the cross section diagram along the cross section line B-B' in FIG. 3). Besides, when viewed in a top view, the cutting hard mask 28 is adjacent to the first slot contact openings 136 and directly contacts the first slot openings 136 (as shown in the following FIG. 5).

In addition, after the first slot openings 136 and the second contact openings 236 are formed, the cutting hard mask 28 can be selectively removed, or it can be removed in the following steps. If the cutting hard mask 28 and the third dielectric layer 30 are removed, as shown in FIGS. 5-6, wherein FIG. 6 shows the cross section diagram along the cross section line C-C' in FIG. 5. The step-height portion 27 is exposed, and a plurality of contact holes are then formed within the first region 100 and within the second region 200. The contact holes includes at least one first contact hole 140 disposed within the first region 100, disposed in the first ILD 22 and the in second dielectric layer 26. Besides, the first contact hole 140 penetrates the step-height portion 27 and the cap layer 24 on each metal gate 112, to expose parts of the metal gate 112; similarly, the second contact hole 240 is disposed within the second region 200, disposed in the first ILD 22 and the second dielectric layer 26 too, and the second contact hole 240 also penetrates the cap layer 24 on each metal gate 212, to expose parts of the metal gate 212. Finally, a conductive layer 50 is filled in the first contact hole 140, the second contact hole 240, the first slot openings 136 and the second contact openings 236 simultaneously, so as to form the contact plugs 152 within the first region 100, and the contact plugs 252 within the second region 200 electrically connect to the metal gate 12 (wherein the contact plugs can replace the M0 and the lower contacts structure electrically connected to the metal gate in conventional process, denoted here as the 0th metal contact, M0PY), and to form the contact plugs (not shown) electrically connect to the S/D region 14 (or the epitaxial layer 15). The processes mentioned above are well known to those skilled in the art, and will not be described in detail here. Besides, if the cutting hard mask 28 has not been removed yet, it can be removed after the first contact hole 140 and the second contact hole 240 are formed, and it should also be within the scope of the present invention.

Generally, since the first contact hole 140 and the second contact hole 240 are formed through a same process, the first contact hole 140 and the second contact hole should have the same depth (d). However, due to the step-height portion 27 existing within the first region 100, the vertical distance H2 between the fin structure 216 to the bottom surface of the second contact hole 240 is smaller than the vertical distance H1 between the fin structure 116 to the bottom surface of the first contact hole 140. In this case, after the conductive layer 50 is filled in the second contact hole 240, it may have some risk to contact and short with the adjacent the source/drain region 14 or other elements.

Figure 7:
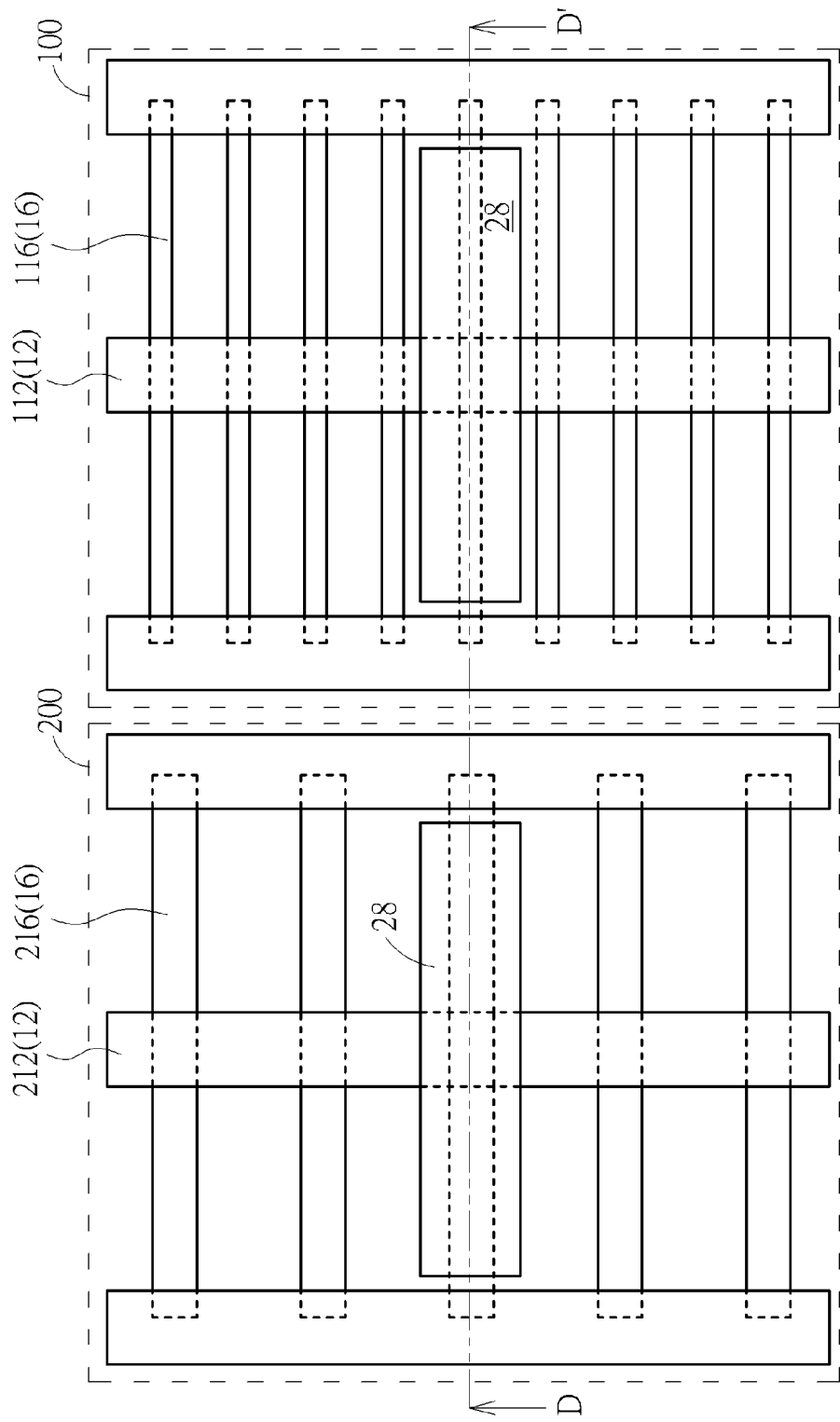
Figure 8:
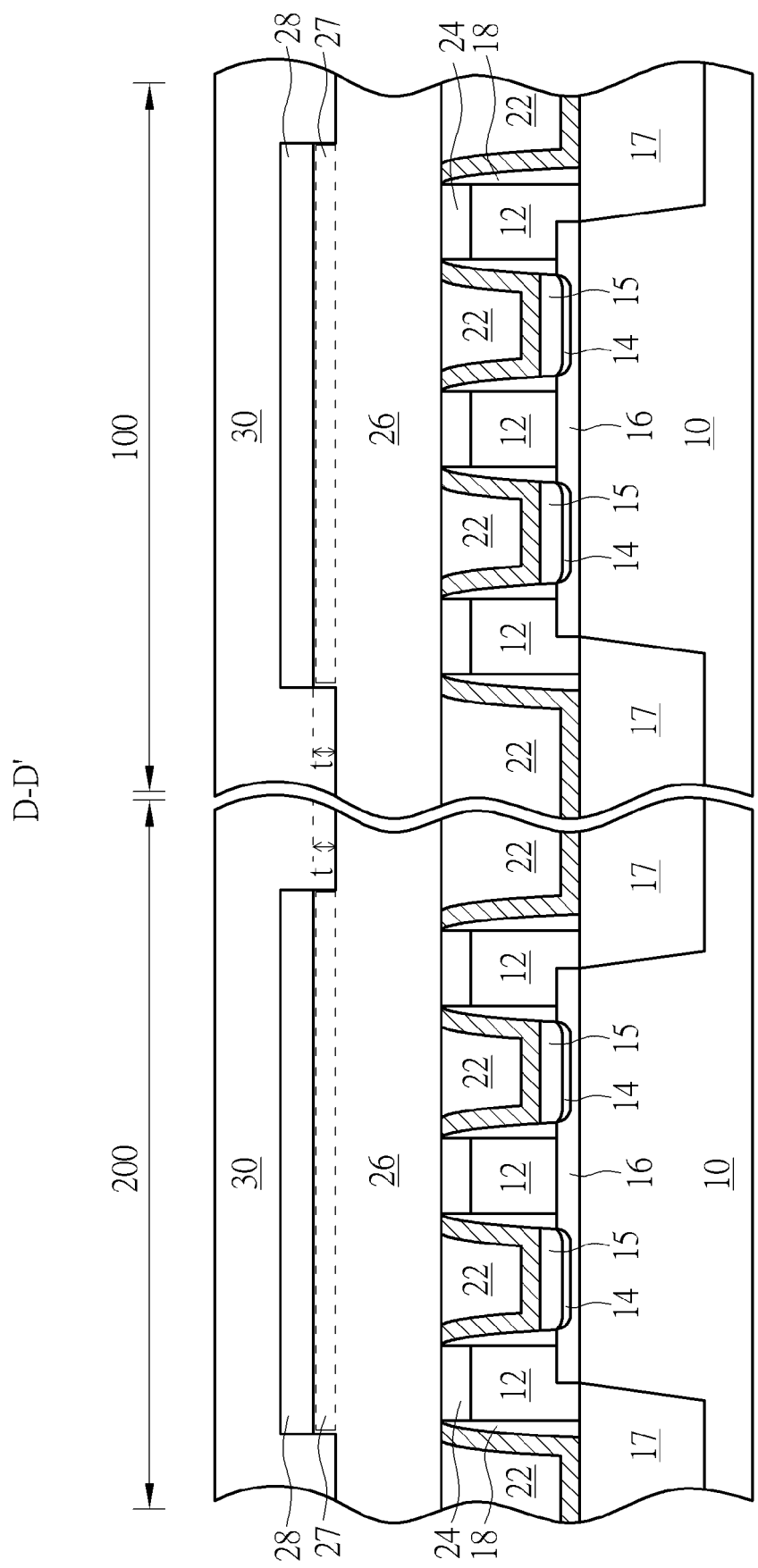
Figure 9:
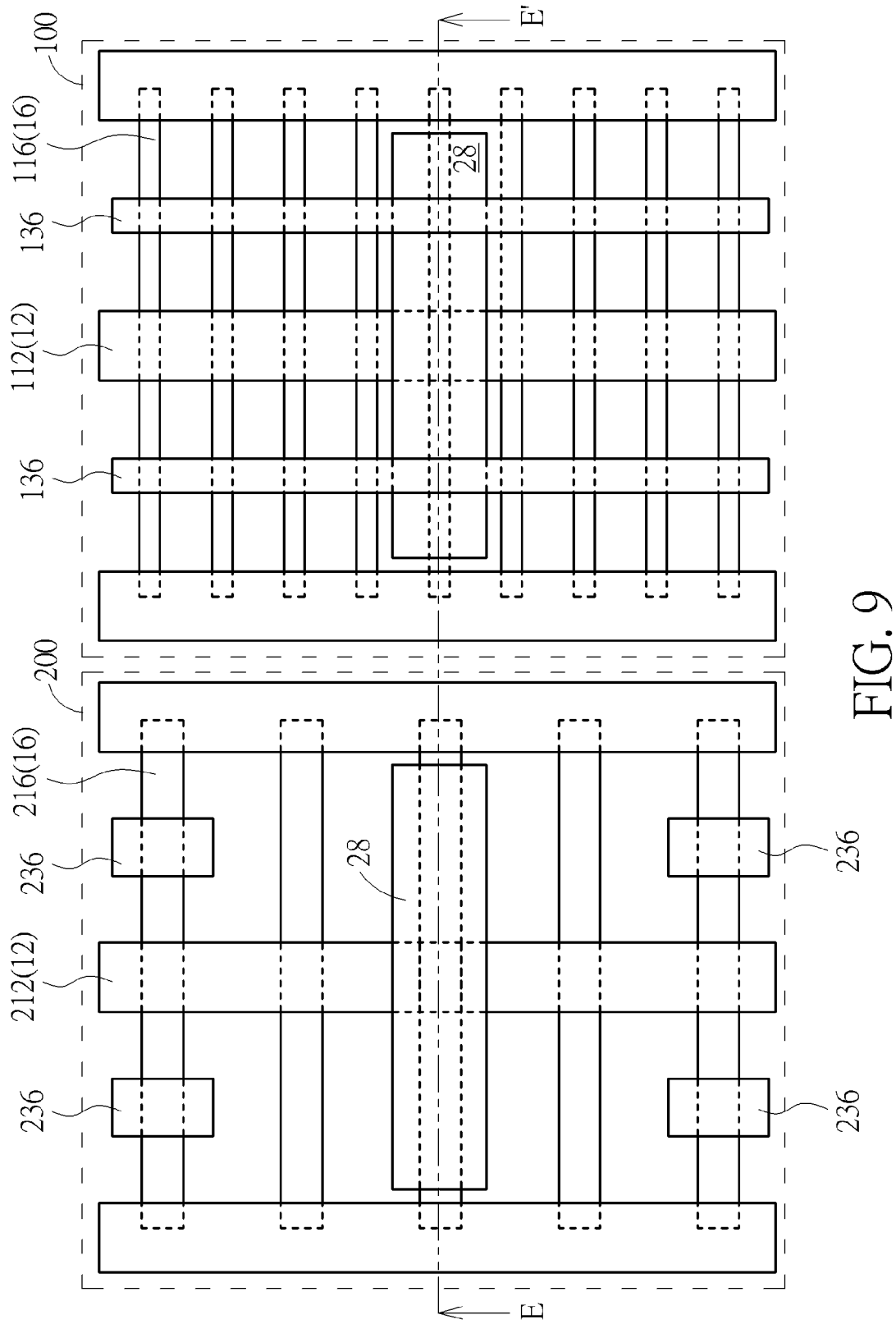
Figure 10:
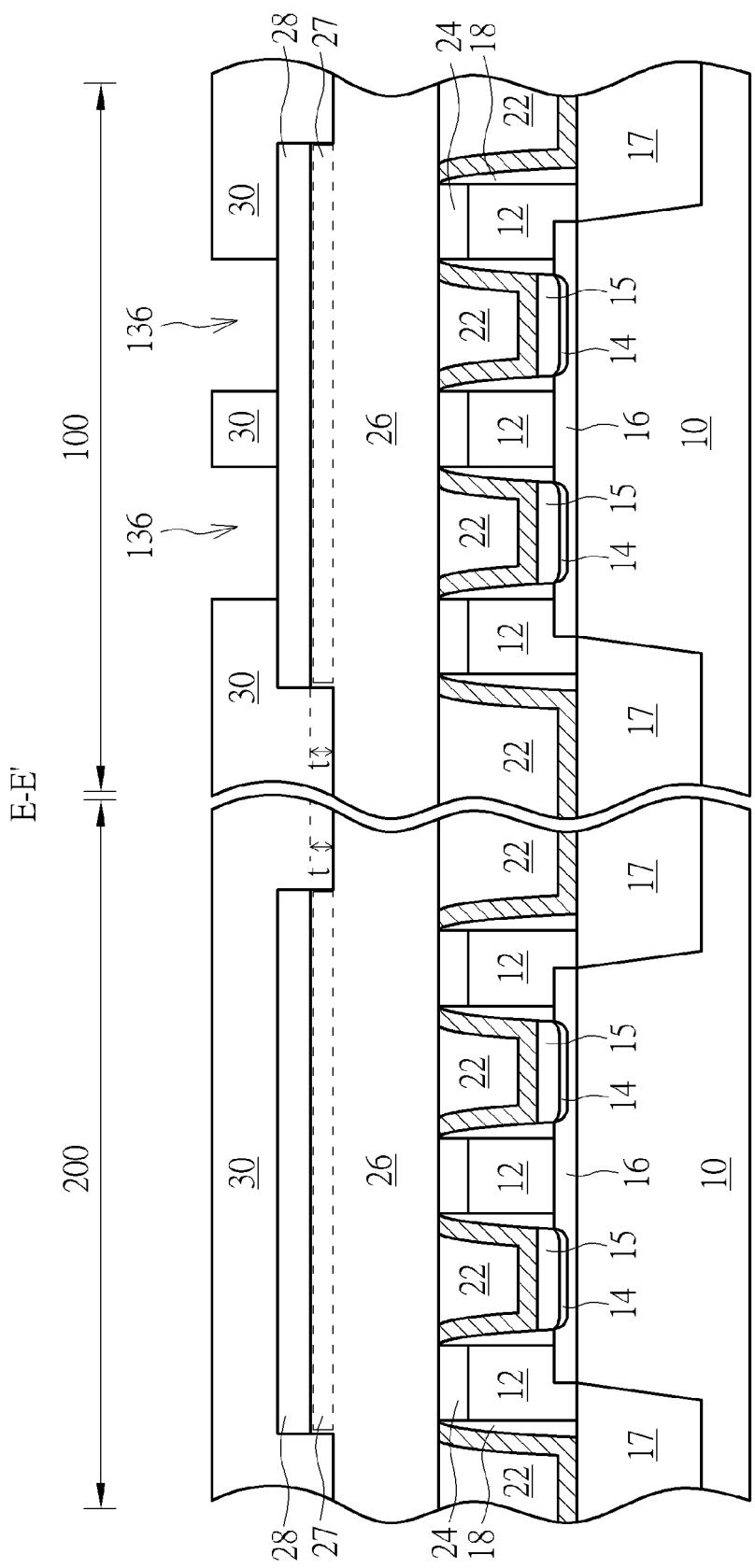
Figure 11:
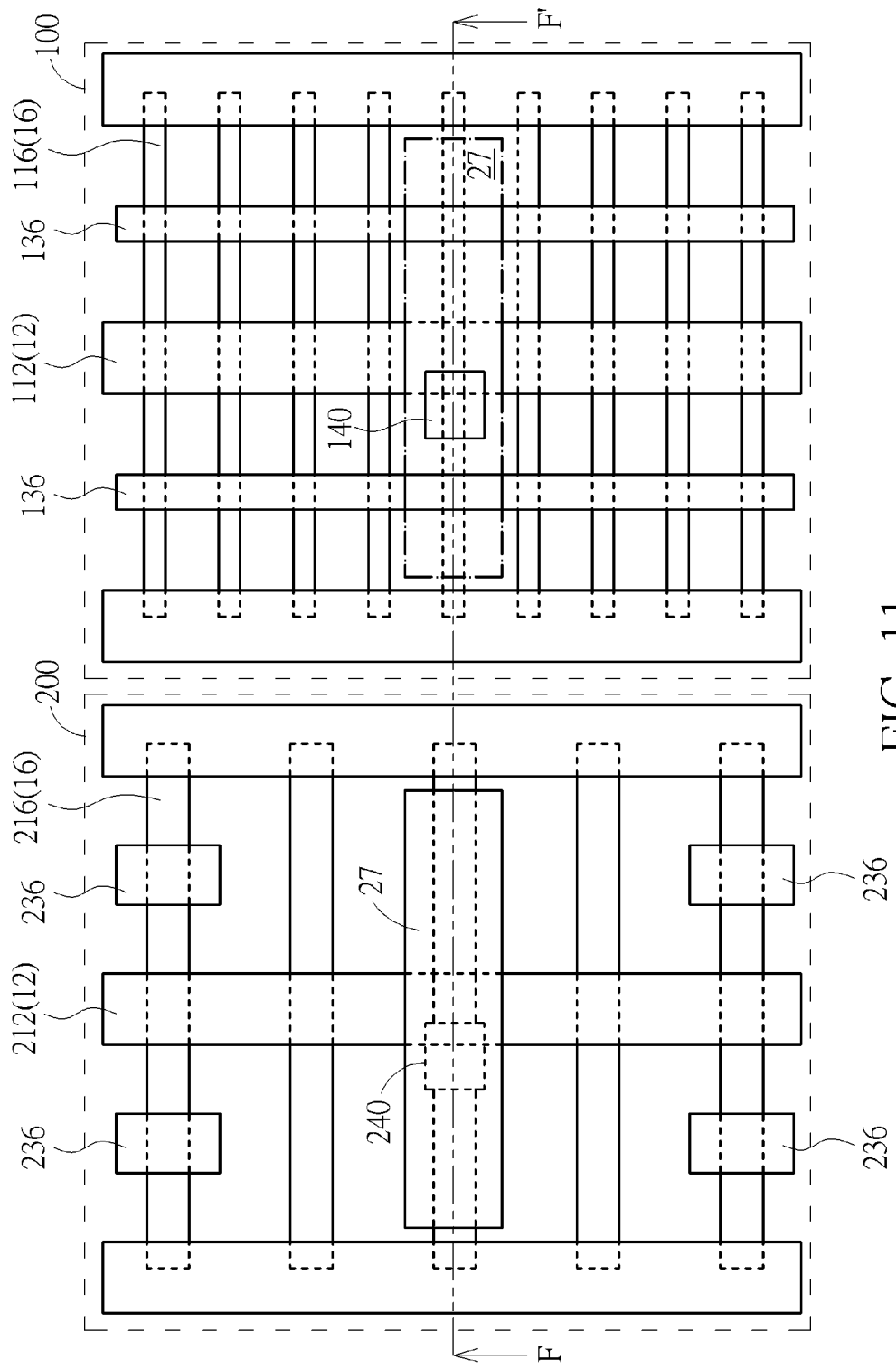
Figure 12:
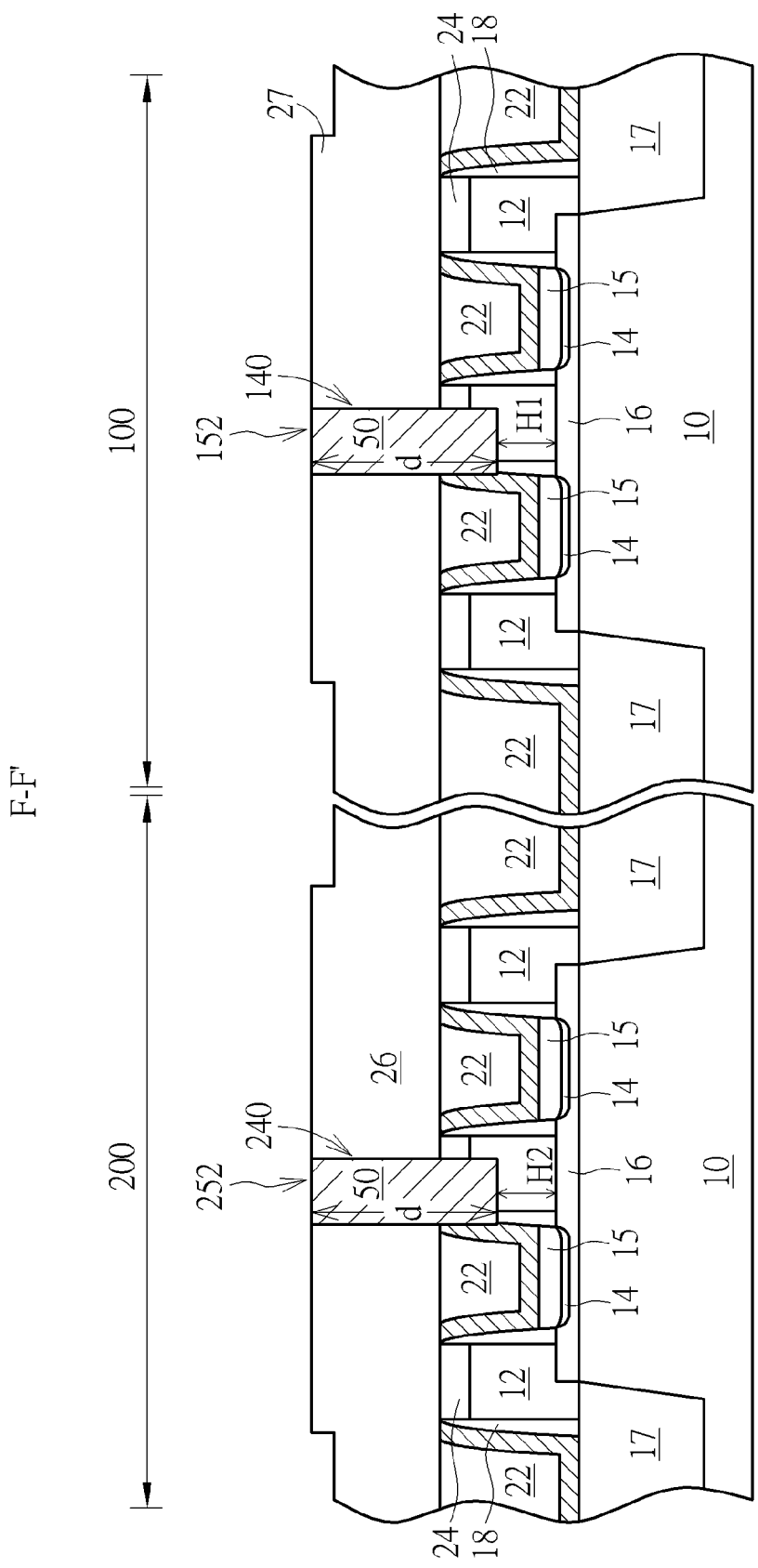

To solve the issue mentioned above, the present invention further provides another method for manufacturing contact holes of a semiconductor device according to the second preferred embodiment of the present invention. Please refer to FIGS. 7-12, wherein FIGS. 7, 9 and 11 are schematic top view diagrams showing a semiconductor device according to the second preferred embodiment of the present invention, and FIGS. 8, 10 and 12 are schematic cross section diagrams showing a semiconductor device according to the second preferred embodiment of the present invention. To simplify the description, the following description will detail the dissimilarities among the different embodiments and the identical features will not be redundantly described. In order to compare the differences between the embodiments easily, the identical components in each of the following embodiments are marked with identical symbols.

As shown in FIG. 7-8, wherein FIG. 8 shows the cross section diagram along the cross section line D-D' in FIG. 7. In this embodiment, the semiconductor device 1 also includes at least two regions: a first region 100 and a second region 200, which respectively represent different regions of a semiconductor device. The difference between the first region 100 and the second region 200 is that in the following steps, at least one slot-cut process will be performed within the first region 100, so as to divide or to sectionalize a slot contact into two or more segments. But the slot-cut process does not need to be performed within the second region 200. Generally, the first region 100 includes the elements that have smaller size or smaller critical dimension than that of the elements within the second region 200. For example, the first region 100 such as a region comprises at least one static random access memory (SRAM) disposed therein, and the second region 200 such as a region comprises at least one logic circuit.

The issue mentioned in the first preferred embodiment is due to the cutting hard mask 28 only being disposed within the first region 100. Therefore, the step-height portion 27 is also only disposed within the first region 100. In this way, the vertical distance between the fin structure to the bottom surface of the second contact within the second region hole is different from the vertical distance between the fin structure to the bottom surface of the first contact hole within the first region, and thereby causing the risk of shorting (especially within the second region). To solve the issue mentioned above, the difference between this embodiment and the first preferred embodiment is that the cutting hard mask 28 is not only formed on the second dielectric layer 26 within the first region 100, but also be formed on the second dielectric layer 26 within the second region 200. In this way, the step-height portion 27 therefore exists within both the first region 100 and the second region 200, as shown in FIGS. 7-8. It is noteworthy that in order to simplify the description, FIG. 7 only shows the metal gates 12, the fin structures 16 and the cutting hard masks 28, other elements shown in FIG. 8 are omitted and not shown in FIG. 7.

Afterwards, as shown in FIG. 9, in order to form the metal plug that is electrically connected to the S/D region 14 (wherein the metal plug can replace the M0 and the lower contacts structure electrically connected to the S/D region in conventional process, denoted here as the 0th metal contact, M0CT), a M0CT etching process is then performed. More precisely, a hard mask (not shown) is firstly formed on the third dielectric 30 and on the cutting hard mask 28 within the first region and within the second region 200. It is noteworthy that the hard mask includes a plurality of openings: some first opening disposed within the first region 100 and some second openings disposed within the second region 200. In this embodiment, each first opening is a slot opening, and partially overlaps the cutting hard mask 28 (as shown in FIG. 9) within the first region 100, but the second opening does not overlap the cutting hard mask 28 within the second region 200. Afterwards, at least one etching process is performed, to transfer the patterns of the first openings and the patterns of the second openings to other layers disposed below, including the third electric layer 30, the second dielectric layer 26 and the first ILD 22, so as to form a plurality of first slot openings 136 at least in the first ILD 22 within the first region 100, and to form a plurality of second contact openings 236 at least in the first ILD 22 within the second region 200, and the S/D region 14 (or the epitaxial layer 15) is finally exposed by the first slot openings 136 and the second contact openings 236.

It is noteworthy that since the pattern of the first opening partially overlaps the cutting hard mask 28, during the etching process for forming the first slot openings 136, the cutting hard mask 28 cannot be removed during the etching process, and it will still be disposed on the second dielectric layer 26 after the M0CT etching process is performed. In this way, the cutting hard mask 28 will protect the second dielectric layer 26 that is disposed right below it, and each first opening may be divided or be sectionalized into two first slot openings 136 in the first ILD 22 and the second dielectric layer 26. It is noteworthy that in this embodiment, since some of the third dielectric layer 30 is removed during the process for forming the first slot openings 136, and the cutting hard mask 28 within the first region 100 is then partially exposed by the first slot openings 136, the cutting hard mask 28 within the second region 200 is still covered by the third dielectric layer 30 (as shown in FIG. 10, wherein FIG. 10 shows the cross section diagram along the cross section line E-E' in FIG. 9). Besides, when viewed in a top view, the cutting hard mask 28 within the first region 100 is adjacent to the first slot contact openings 136 and directly contacts the first slot openings 136, but the cutting hard mask 28 within the second region 200 does not contact the second contact openings 236 (as shown in the following FIG. 11).

After the first slot openings 136 and the second contact openings 236 are formed, the cutting hard mask 28 within the first region 100 and within the second region 200 can be selectively removed, or it can be removed in the following steps. If the cutting hard mask 28 and the third dielectric layer 30 are removed, as shown in FIGS. 11-12, wherein FIG. 12 shows the cross section diagram along the cross section line F-F' in FIG. 11. The step-height portion 27 is exposed, and a plurality of contact holes are then formed within the first region 100 and within the second region 200. The contact holes include at least one first contact hole 140 disposed within the first region 100, disposed in the first ILD 22 and the second dielectric layer 26, and the first contact hole 140 penetrates the step-height portion 27 and the cap layer 24 on each metal gate 112, and expose parts of the metal gate 112. Similarly, the second contact hole 240 is disposed within the second region 200, disposed in the first ILD 22 and the second dielectric layer 26 too, and the second contact hole 240 also penetrates step-height portion 27 and the cap layer 24 on each metal gate 212, and exposes parts of the metal gate 212. Finally, a conductive layer 50 is filled in the first contact hole 140, the second contact hole 240, the first slot openings 136 and the second contact openings 236 simultaneously, so as to form the contact plugs 152 within the first region 100 and the contact plugs 252 within the second region 200 electrically connect to the metal gate 12, and to form the contact plugs (not shown) electrically connect to the S/D region 14 (or the epitaxial layer 15) respectively. The processes mentioned above are well known to those skilled in the art, and will not be described in detail here. Besides, if the cutting hard mask 28 has not been removed yet, it can be removed after the first contact hole 140 and the second contact hole 240 are formed, it should also be within the scope of the present invention.

Generally, since the first contact hole 140 and the second contact hole 240 are formed through a same process, the first contact hole 140 and the second contact hole should have the same depth (d). In this embodiment, since the step-height portion 27 exists within both the first region 100 and the second region 200. Therefore, the vertical distance H2 between the fin structure 216 to the bottom surface of the second contact hole 240 should be the same as the vertical distance H1 between the fin structure 116 to the bottom surface of the first contact hole 140, thereby preventing the shorting risk mentioned in the first preferred embodiment.

In summary, the key feature of the present invention is to provide a method for forming contact holes of a semiconductor device, the semiconductor device including two regions: a first region and a second region, wherein in manufacturing processes, a slot cut process will be performed within the first region, but not performed within the second region. However, in one embodiment of the present invention, the cutting hard mask is not only formed within the first region, but also be formed within the second region. Since the following-formed contact plugs have the same depth, the vertical distance between the fin structure to the bottom surface of each contact plug can be controlled well, thereby avoiding the shorting issue.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for manufacturing contact holes of a semiconductor device, comprising:
    providing a first dielectric layer, a first region and a second region being defined on the first dielectric layer;
    forming at least one first cutting hard mask on the first dielectric layer, disposed within the first region, and forming at least one second cutting hard mask on the first dielectric layer, disposed within the second region;
    etching the first dielectric layer, so as to form at least one first step-height portion disposed right below the at least one first cutting hard mask, and etching the first dielectric layer, so as to form at least one second step-height portion disposed right below the at least one second cutting hard mask;
    forming at least one first slot opening within the first region, wherein the at least one first slot opening partially overlaps the at least one first cutting hard mask and directly contacts the at least one first cutting hard mask, and forming at least one second contact opening within the second region, wherein the at least one second contact opening does not contact the at least one second cutting hard mask directly; and
    forming at least one first contact hole within the first region, wherein the at least one first contact hole penetrates through the at least one first step-height portion, and forming at least one second contact hole within the second region, wherein the at least one second contact hole penetrates through the at least one second step-height portion.

2. The method of claim 1, further comprising forming a second dielectric layer on the first dielectric layer and covering the at least one first cutting hard mask and the at least one second cutting mask.

3. The method of claim 2, wherein the at least one first cutting hard mask is partially exposed by the at least one first slot opening within the first region, but the at least one second cutting hard mask is still covered by the second dielectric layer within the second region before the at least one second contact hole is formed.

4. The method of claim 1, wherein the at least one first contact hole and the at least one second contact hole are disposed in the first dielectric layer.

5. The method of claim 1, wherein the at least one first slot opening is sectionalized by the at least one first cutting hard mask within the first region.

6. The method of claim 1, further comprising removing the at least one first cutting hard mask and the at least one second cutting hard mask after the at least one first contact hole and the at least one second cutting hard mask are formed.

7. The method of claim 1, further comprising removing the at least one first cutting hard mask after the at least one first slot opening and the at least one second contact opening are formed, and before the at least one first contact hole and the at least one second contact hole are formed.

8. The method of claim 1, further comprising providing a substrate, and the first dielectric layer is disposed on the substrate.

9. The method of claim 8, further comprising forming a gate structure on the substrate, the gate structure including a gate electrode and a cap layer disposed thereon.

10. the method of claim 9, wherein the at least one first contact hole and the at least one second contact hole penetrate through the cap layer of the gate structure and partially expose the gate electrode of the gate structure.

11. The method of claim 10, further comprising forming a conductive layer in the at least one first contact hole and the at least one second contact hole, in the at least one first slot opening and in the at least one second contact opening simultaneously.

12. The method of claim 8, further comprising forming a fin structure on the substrate.

13. The method of claim 1, wherein the at least one first contact hole and the at least one second contact hole have a same depth.

14. The method of claim 1, wherein both the at least one first slot opening and the at least one second contact opening are disposed in the first dielectric layer.

* * * * *